(12) United States Patent
Resler et al.

(10) Patent No.: US 8,698,200 B2
(45) Date of Patent: Apr. 15, 2014

(54) GALLIUM NITRIDE FOR LIQUID CRYSTAL ELECTRODES

(75) Inventors: Daniel P. Resler, Carlisle, MA (US); William E. Hoke, Wayland, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/572,157

(22) Filed: Aug. 10, 2012

(65) Prior Publication Data

US 2012/0299012 A1     Nov. 29, 2012

Related U.S. Application Data

(62) Division of application No. 12/817,421, filed on Jun. 17, 2010, now Pat. No. 8,268,707.

(60) Provisional application No. 61/219,146, filed on Jun. 22, 2009.

(51) Int. Cl.
    *H01L 29/66*           (2006.01)

(52) U.S. Cl.
    USPC ............... 257/194; 257/E29.246; 438/483; 438/455; 349/42

(58) Field of Classification Search
    USPC ........................................ 349/42–49
    See application file for complete search history.

(56) References Cited

U.S. PATENT DOCUMENTS

| | | | |
|---|---|---|---|
| 4,882,235 A | 11/1989 | Resler | |
| 5,140,386 A | 8/1992 | Huang et al. | |
| 6,099,970 A | 8/2000 | Bruno et al. | |
| 6,103,604 A | 8/2000 | Bruno et al. | |
| 6,861,270 B2 | 3/2005 | Sakai | |
| 6,884,647 B2 | 4/2005 | Sakai et al. | |
| 7,005,685 B2 | 2/2006 | Sakai et al. | |
| 7,015,511 B2 | 3/2006 | Sakai et al. | |
| 7,226,850 B2 | 6/2007 | Hoke et al. | |
| 7,365,369 B2 | 4/2008 | Nakamura et al. | |
| 7,432,142 B2 | 10/2008 | Saxler et al. | |
| 7,557,378 B2 | 7/2009 | LaRoche et al. | |
| 2008/0239458 A1 | 10/2008 | Sachs et al. | |

OTHER PUBLICATIONS

Jessen, et al.; "AlGaN/GaN HEMT on Diamond Technology Demonstration;" IEEE Compound Semiconductor Integrated Circuit Symposium; Nov. 12, 2006; pp. 271-274.
Hohkawa, et al.; "Single Phase Transducer Consisting of AlGaN/GaN;" IEEE International Ultrasonics Symposium; Nov. 2, 2008; pp. 1928-1931.
PCT Search Report of the ISA for PCT/US2010/038992 dated Oct. 26, 2010.
Shen, et al.; AlGaN/AlN High-Power Microwave HEMT; IEEE vol. 22, No. 10, Oct. 2001; pp. 457.
Transmittal of International Preliminary Report on Patentability for PCT/US2010/038992 dated Jan. 12, 2012.
Written Opinion of the ISA for PCT/US2010/038992 dated Oct. 26, 2010.
U.S. Appl. No. 12/817,421 downloaded on Jul. 31, 2012; 146 pages.

*Primary Examiner* — Sonya D McCall Shepard
(74) *Attorney, Agent, or Firm* — Daly, Crowley, Mofford & Durkee, LLP

(57) ABSTRACT

Described herein is a liquid crystal (LC) device having Gallium Nitride HEMT electrodes. The Gallium Nitride HEMT electrodes can be grown on a variety of substrates, including but not limited to sapphire, silicon carbide, silicon, fused silica (using a calcium flouride buffer layer), and spinel. Also described is a structure provided from GaN HEMT grown on large area silicon substrates and transferred to another substrate with appropriate properties for OPA devices. Such substrates include, but are not limited to sapphire, silicon carbide, silicon, fused silica (using a calcium fluoride buffer layer), and spinel. The GaN HEMT structure includes an AlN interlayer for improving the mobility of the structure.

11 Claims, 2 Drawing Sheets

GALLIUM NITRIDE FOR LIQUID CRYSTAL ELECTRODES

CROSS-REFERENCE TO RELATED APPLICATIONS

This application is a Divisional application and claims the benefit of co-pending application Ser. No. 12/817,421 filed on Jun. 17, 2010 which claims priority under 35 U.S.C. §119(e) from U.S. Provisional Patent Application No. 61/219,146, filed Jun. 22, 2009, which applications are both hereby incorporated herein by reference in their entireties for all purposes.

STATEMENT REGARDING FEDERALLY SPONSORED RESEARCH

This invention was made with government support under Grant No. FA8650-05-C-7211 awarded by the U.S. Air Force. The government has certain rights in this invention.

FIELD OF THE INVENTION

The structures and techniques described herein relate to liquid crystal devices and, more particularly to electrodes used in liquid crystal devices.

BACKGROUND OF THE INVENTION

As is also known in the art, liquid crystal (LC) devices utilize transparent electrodes which are necessary to establish electrical fields within the device to produce desired and controllable modifications to the liquid crystal optical material properties. One widely used method of electrode formation to date is the deposition of a thin-film semiconductor such as indium-tin-oxide (ITO) or $In_2O_3$. Such conductive thin film semiconductors are inherently lossy particularly in the infrared wavelengths due to theft high electron concentrations and low carrier mobilities.

Transparent conductors are required in various applications. For example, in optical phased arrays (OPA's) a steered beam passes through electrical conductors that bias and address the liquid crystal molecules in the device. Preferably, the conductors exhibit very low electrical resistance as well as very low absorption at the wavelength of the steered beam. Using conventional techniques to provide transparent electrodes in OPA elements, indium oxide is disposed on sapphire substrates. To achieve satisfactory conductivity, the indium oxide is highly doped. In current technology, nonstoichiometric indium oxide is used as the transparent conductor. For a sheet resistance of 400 ohm/sq, the optical absorption to 1.06 µm laser light is 0.75-1.0%. Lower optical absorption and resistivity are desired for transparent electrodes to improve system performance, reduce optical bases, and reduce adverse laser heating in the system. Thus, one drawback to using highly doped indium oxide as electrodes (e.g. in OPA elements) is that such electrodes increase optical absorption of a steered optical beam.

Another drawback with the above-described approach is the use of substrates that exhibit birefringence (e.g. sapphire substrates). Substrates exhibiting birefringence alter the polarization of a steered optical beam. For polarization sensitive applications, an alternative substrate material having low optical absorption and minimal or no birefringence is desired. Thus, one alternative to using sapphire as a substrate is to use cubic spinel, (which does not exhibit birefringence) as a substrate. One drawback of crystal cubic spinel, however, is that it is relatively expensive compared with other substrate materials (e.g. compared with the cost of sapphire, for example). Furthermore crystal cubic spinel substrates are only available in relatively small diameters (e.g. two-inch diameters). For some applications, only one-half of an OPA can be fabricated from one two-inch substrate.

SUMMARY OF THE INVENTION

To overcome the above-noted drawback of using highly doped indium oxide conductors, and in accordance with the concepts, structures and techniques described herein, highly conductive gallium nitride high electron mobility transistor structures (GaN HEMTs) are deposited or otherwise disposed on a substrate material, the structure having a mobility that is higher than the mobility of indium oxide. Consequently, fewer carriers are needed to achieve the same conductivity achieved using the prior art indium oxide approach. This results in less free carrier absorption. Thus, the use of GaN HEMTs and spinel overcome the above-noted drawbacks with respect to optical absorption of a steered optical beam and birefringence which alters polarization of a steered optical beam.

To provide a relatively inexpensive structure while overcoming the above-noted drawback of using substrates (e.g. sapphire substrates) that exhibit birefringence or using expensive substrates (e.g. cubic spinel) which do not exhibit birefringence, in one embodiment, a GaN HEMT is deposited on large area, relatively inexpensive, single crystal silicon substrates. The GaN HEMT is then transferred to a substrate which is substantially optically transparent at wavelengths of interest and having little or no birefringence and having a cost which is less than the cost of single crystal spinel. Exemplary symmetric crystals suitable for such use include, but are not limited to fused silica, poly spinel and zinc sulfide (ZnS).

With this particular arrangement, a GaN HEMT having improved mobility is provided. The use of an aluminum nitride (AlN) interlayer results in the HEMT having increased conductivity from improved mobility since alloy scattering at the AlGaN/GaN interface is reduced by the insertion of the AlN interlayer. Furthermore, the deposition of the GaN HEMT on larger area relatively inexpensive silicon single crystal substrates with a subsequent transfer to an optically suitable substrate (e.g. a substrate which may be inexpensive and/or a non-birefringent material) separates out the material growth, which requires high quality single crystal substrates of compatible crystal structure, from the final mounting substrate which no longer needs to be even single crystal. Also, the use of large area wafers enables many more OPS, elements to be fabricated and thus fewer wafers are needed than in prior art approaches.

In accordance with a further aspect of the concepts, structures and techniques described herein, an optical window structure includes a substrate and transparent conductive electrodes provided from gallium nitride (GaN) HEMT. The use of a GaN HEMT as a transparent conductive electrode material results in low optical losses due to the high mobility of the carriers (in the range of 1600-2000 cm2/V-s) allowing lower carrier densities to be used for same required conductivity. A GaN HEMT is also transparent from the visible through the near infrared wavelengths.

A gallium nitride HEMT is commonly grown on a variety of substrates, including but not limited to sapphire, silicon carbide, silicon, and even fused silica (using a calcium flouride buffer layer). For the purpose of liquid crystal (LC) applications, a substrate is selected which is transparent to the wavelength of operation of the LC device (e.g. an optical phased array, an adaptive optic, or a polarization corrector). In one embodiment a GaN layer is epitaxially grown to a specified thickness, for example 1 micron (um). Growth of a second layer of higher bandgap aluminum gallium nitride ($Al_xGa_{1-x}N$) where x is between 0 and 1 or aluminum nitride (AlN) forms a two-dimensional electron gas at the AlGaN/GaN interface, from which the conductivity is derived. Photolithographic processing can be used to define electrode structures on a surface of a wafer. Etching the second layer (e.g. the $Al_xGa_{1-x}N$ layer) provides semi-insulating regions between the desired electrode patterns where this second layer has been removed. Subtractive or additive processes (or a combination of subtractive and additive processes) may be used to provide the desired structure. In one embodiment, an AlN interlayer is disposed between a GaN layer and an AlGaN top layer. With this particular arrangement, a structure having improved mobility provided by inclusion of the AlN interlayer is provided.

In one embodiment, an LC phase retarder is provided from GaN HEMT layers grown on sapphire substrates. A single electrode of AlGaN/GaN is provided on each containing surface.

In accordance with a further aspect of the present invention, low cost, large area transparent electrode-substrate combinations that do not exhibit birefringence and have improved conductivity are described as well as a process for providing such structures.

A process for providing transparent electrode-substrate combinations that do not exhibit birefringence and have improved conductivity includes: (a) growing a GaN HEMT structure containing an aluminum nitride (AlN) interlayer on a large area, silicon substrate having a crystallographic orientation which promotes growth of hexagonal AlN and GaN and which may be inexpensive; (b) after growth, an AlGaN surface of the GaN HEMT structure is mounted to a carrier wafer; (c) the GaN HEMT structure containing the AlN interlayer is then removed or otherwise separated from the silicon substrate; (d) an optically suitable substrate (which can have cubic symmetry or be amorphous or polycrystalline) is then bonded or otherwise secured to the exposed surface (in some applications it may be preferred to utilize an optically suitable substrate having little or no birefringence); (e) the carrier wafer is then removed or otherwise separated from the AlGaN surface; and (f) electrode(s) and ohmic contacts(s) are then provided on the AlGaN surface (e.g. via a patterning technique or any other technique well-known to those of ordinary skill in the art).

The benefits of this structure and process over conventional structures and processes are: (a) the structure and process described herein is relatively inexpensive (compared to existing prior art approaches) and uses large area silicon substrates (e.g. relatively inexpensive silicon substrates with the desired <111> orientation can be obtained in diameters of 200-mm); (b) the GaN HEMT structure exhibits improved conductivity compared to ITO due to the improved transport properties of the GaN HEMT which are further enhanced by the AlN interlayer; and (c) the GaN HEMT has low optical absorption and in particular, lower than ITO.

In one embodiment, a silicon substrate having a <111> crystallographic orientation is used due to the hexagonal net of silicon atoms which promotes growth of hexagonal AlN and GaN. The silicon substrate may be removed by either a dry or wet etch. This process is readily achieved due to the much higher chemical reactivity of silicon compared to AlN and GaN.

The substrate may be bonded to the etched surface with an epoxy or an adhesive (e.g. a UV curing adhesive) or any other material capable of securing together the substrate and etched surface and which has a low NIR (near infrared) absorption (e.g. an absorption lower than that of ITO such as about 0.3% or less) and which is compatible with LC applications (e.g. OPAs, adaptive optics, polarization correctors, LC phase retarders). Substrates suitable for use in LC applications (including those listed above), include, but are not limited to polycrystalline spinel substrates, ALON substrates, fused silica substrates, and zinc sulfide (ZnS) substrates.

U.S. Pat. No. 6,099,970, issued to Bruno at al, and assigned to TRW, Inc Redondo Beach, Calif., describes using a plurality of AlGaN/GaN/AlGaN quantum wells for transparent electrodes. The quantum wells increase the carrier concentration and thereby lower the conductivity but also increase the free carrier absorption.

It should be appreciated, however, that the structure described herein, is a single sided AlGaN/AlN/GaN heterojunction. The conductivity, which is inversely proportional to mobility, is increased by increasing the mobility with the AlN interlayer. The electron mobility is increased by inserting an AlN interlayer from approximately 1600 to 2000 $cm^2/Vs$. Birefringence is reduced (or in some cases minimized or even eliminated) by bonding the layer stack to a material with low or no birefringence (e.g. a cubic, amorphous, or polycrystalline structure). One important feature of this process is that the crystal growth process, which requires high quality single crystal material of compatible crystalline structure, is not dependent upon the choice of final substrate material. This characteristic permits use of appropriate polycrystalline materials of various lattice constants and orientations. For example, polycrystalline spinel can be used as the final substrate material which is less expensive and available in larger areas than single crystal spinel.

In accordance with a further aspect of the present invention, described herein is a structure and process that reduces cost of optical phased array elements, reduces (or in some cases minimizes) polarization changes in a steered optical beam, reduces (or in some cases minimizes) optical absorption of a steered optical beam, and increases conductivity of transparent electrodes.

In accordance with a still further aspect, a liquid crystal (LC) device having gallium nitride (GaN) HEMT electrodes is described. The GaN HEMT electrodes can be grown on a variety of substrates, including but not limited to sapphire, silicon carbide, silicon, fused silica (using a calcium fluoride buffer layer), and spinel. In LC applications, the substrate is selected from a material which is transparent to the wavelength of operation of the LC device (e.g. an optical phased array, an adaptive optic, or a polarization corrector). In one embodiment, the GaN electrode layer is epitaxially grown to a specified thickness. Growth of a second layer of higher bandgap $Al_xGa_{1-x}N$ or AlN forms a two-dimensional electron gas, from which the conductivity is derived. In one embodiment, photolithographic processing (using either positive or negative masks) can be used to define the electrode structures on the face of the wafer. An additive or subtractive process (e.g. etching the second AlGaN or AlN layer) can be used to provides semi-insulating regions between the desired electrode patterns where the second layer is absent (e.g. removed via an etching process).

Also described is a structure provided from a GaN HEMT grown on a large area silicon substrate and transferred to a second, different substrate with appropriate properties for OPA devices. In one embodiment, an AlN interlayer is disposed between a GaN layer and an AlGaN top layer. With this particular arrangement, a GaN HEMT structure having improved mobility provided by inclusion of the AlN interlayer is provided. Materials suitable for use as the second substrate include, but are not limited to materials such as poly spinel, or fused silica (using a calcium fluoride buffer layer). Poly SiC as well as Zinc Sulfide (ZnS) may also be used as materials for the second substrate. Depending upon the needs/requirements of a particular application (e.g. cost characteristics, thermal conductivity characteristics, spectral band characteristics, birefringence characteristics), any of the following materials may be used:

| Material | Cost | Thermal Conductivity | Spectal Band | Birefringent |
|---|---|---|---|---|
| Fused Silica | Low | Low | vis-NIR | No |
| AlON | Med | High | vis-NIR | No |
| CaF2 | Med | High | UV-vis-NIR | No |
| GaAs | Med | Very high | NIR-LWIR | No |
| GGG (Gd3Ga5O12) | High | Med-High | vis-NIR | No |
| Sapphire | Med | High | vis-NIR | Yes |
| Silicon Carbide | High | Very high | NIR | Yes |
| polycrystalline Spinel | Med | High | vis-NIR | No |
| $Y_2O_3$ | High | High | vis-NIR | No |
| YAG ($Y_3Al_{15}O_{12}$) | High | High | vis-NIR | No |
| Zinc Selenide | High | High | NIR-LWIR | No |
| Zinc Sulfide (ZnS) | Med | High | vis-NIR | No |
| polycrystalline SiC | Med | High | NIR | Yes |

BRIEF DESCRIPTION OF THE DRAWINGS

The foregoing features of the concepts, structures and techniques described herein may be more fully understood from the following description of the drawings in which.

DETAILED DESCRIPTION OF THE PREFERRED EMBODIMENTS

Figure 1:
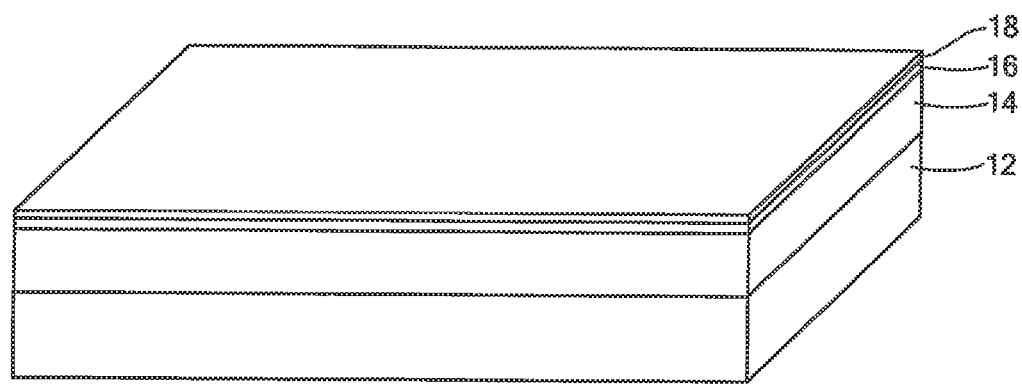
FIG. 1 is a perspective view of a transparent window using a gallium nitride (GaN) high electron mobility transistor (HEMT) structure.

Referring now to FIG. 1 a transparent multi-electrode window using a gallium nitride (GaN) high electron mobility transistor (HEMT) structure includes a substrate 12 having an aluminum nitride (AlN) layer 14 disposed thereover with a semi-insulating gallium nitride (GaN) layer 16 disposed thereover. Substrate 12 may be provided from a number of materials, including but not limited to sapphire, SiC, Si, or Spinel. In one exemplary embodiment, GaN layer 16 is provided having a thickness typically in the range of about 1-3 microns (μm) and AlN layer 14 is provided having a thickness typically less than about 0.1 μm. In some applications, a thickness of 0.05 μm is preferred.

Disposed over the semi-insulating GaN layer 16 is a topmost AlN or $Al_xGa_{1-x}N$ layer 18. In one embodiment, the topmost $Al_xGa_{1-x}N$ layer 18 is provided having a thickness typically in the range of about 50-400 angstroms (Å) with about 200 Å being preferred in some applications.

Figure 2:
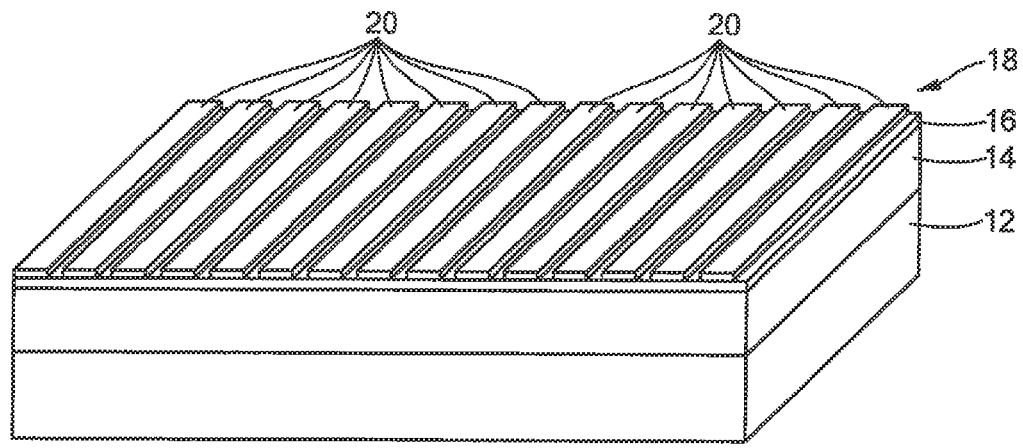
FIG. 2 is a perspective view of a transparent multi-electrode window using a GaN HEMT structure.

Referring now to FIG. 2, in which like elements of FIG. 1 are provided having like reference designations, topmost layer 18 is provided as a plurality of individual electrodes 20. In one embodiment, the plurality of individual AlN or $Al_x$ $Ga_{1-x}N$ electrodes 20 are provided via a microelectronic patterning process and x is in the range of about 0.1 to about 0.4 with about 0.25 being typical. In other embodiments, values outside that range may also be used. A person of ordinary skill in the art will appreciate how to select a value for x for a particular application. It should, of course, be appreciated that other techniques other than microelectronic patterning may also be used to provide electrodes 20.

In one embodiment, the microelectronic patterning process includes spinning and baking of a photoresist over the topmost layer 18. Next, the photoresist is exposed using a mask aligner, stepper, electron beam patterning system, or any other technique known to those of skill in the art. The photoresist is then developed exposing regions between desired conductive regions 20.

The top layer 18 may be etched to provide electrodes 20. In one embodiment, the top layer may be etched by reactive on etching in a chlorine gas. Other etching technique may, of course, also be used. The photoresist is then removed leaving patterned conductive electrodes 20 as shown in FIG. 2.

Figure 3:
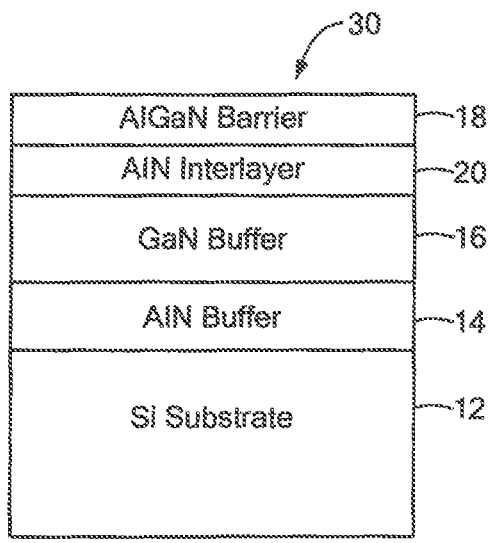
FIG. 3 is a cross-sectional view of a GaN HEMT structure having an aluminum nitride (AlN) interlayer grown on a silicon substrate.
Figure 3A:
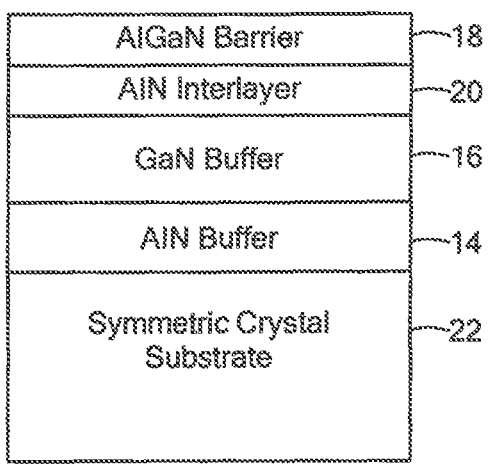
FIG. 3A is a cross-sectional view of a GaN HEMT structure having an AlN interlayer grown on a transparent, low birefringence substrate.

Referring now to FIGS. 3 and 3A in which like elements are provided having like reference designations, a structure and process are described to provide low cost, large area transparent electrode-substrate combinations that do not exhibit birefringence and that have improved conductivity. A GaN HEMT structure 30 includes a substrate 12 provided from <111> silicon (Si) having an AlN buffer layer 14 disposed thereover. Disposed over layer 14 is a GaN buffer layer 16. Disposed over the GaN buffer layer 16 is an AlN interlayer 20 and disposed over interlayer 20 is an AlGaN barrier layer 18.

It should be appreciated that AlN buffer layer 14 is grown on silicon substrate 12 and provides insulation between GaN buffer layer 16 and substrate 12. AlN layer 20, however, is an interlayer between AlGaN top layer 18 and GaN buffer layer 16. AlN layer 20 (also referred to as interlayer 20) improves the mobility and increases carrier density of the structure 30 and consequently increases the conductivity of the GaN HEMT structure 30 for a given free carrier density. The GaN HEMT exhibits improved conductivity due to interlayer 20. In some applications it is desirable to keep the interlayer thin (e.g. on the order of 10 Å) since a relatively thick interlayer increases the difficulty with which ohmic contacts can be made to the structure. It should, however, be appreciated that the interlayer thickness to use in any particular application depends, at least in part, upon the smoothness of the underlying surface (i.e. the surface over which the interlayer is disposed). For example, in some applications, if the underlying surface has a smoothness in the range of 5 Å-15 Å, then an interlayer having a thickness of about 10 Å may be used.

The process comprises growing a GaN HEMT structure containing an AlN interlayer on a large area, relatively inexpensive silicon <111> substrate. This substrate orientation is used due to the hexagonal net of silicon atoms which promotes growth of hexagonal AlN and GaN.

After growth, the AlGaN layer 18 is temporarily mounted to a carrier wafer (not shown). The silicon substrate is removed by either a dry or wet etch. This process is readily achieved due to the much higher chemical reactivity of silicon compared to AlN and GaN. An optically suitable substrate 22 is bonded or otherwise secured to the etched surface. This may be accomplished, for example, using an epoxy or an adhesive (e.g. such as a UV curing adhesive) or using any other technique known to those of ordinary skill in the art. If an epoxy or adhesive is used, it preferably should have low NIR absorption and be compatible with an OPA configuration.

Substrates suitable for bonding to the etched surface are shown in Table 1.

TABLE 1

| Material | Cost | Thermal Conductivity | Spectal Band | Birefringent |
|---|---|---|---|---|
| Fused Silica | Low | Low | vis-NIR | No |
| AlON | Med | High | vis-NIR | No |
| CaF2 | Med | High | UV-vis-NIR | No |
| GaAs | Med | Very high | NIR-LWIR | No |
| GGG (Gd3Ga5O12) | High | Med-High | vis-NIR | No |
| Sapphire | Med | High | vis-NIR | Yes |
| Silicon Carbide | High | Very high | NIR | Yes |
| Polycrystalline Spinel | High | High | vis-NIR | No |
| $Y_2O_3$ | High | High | vis-NIR | No |
| YAG ($Y_3Al_{15}O_{12}$) | High | High | vis-NIR | No |
| Zinc Selenide | High | High | NIR-LWIR | No |
| Zinc Sulphide | Med | High | vis-NIR | No |
| polycrystalline SiC | Med | High | MR | Yes |

The carrier wafer is then removed from the AlGaN surface. One or more electrodes and/or ohmic contacts may then be provided (e.g. using a patterning technique or any additive and/or subtractive process) on the AlGaN surface to provide the structure having one or more electrodes and ohmic contacts. It is believed that the general process of transferring a GaN HEMT from a large area single crystal silicon <111> substrate needed for single crystal growth to another substrate (not necessarily being single crystal) but having the proper optical properties for OPA's is a novel technique for providing optical windows suitable for use in a wide variety of optical devices and applications.

The benefits of this structure and process over conventional structures and processes include but are not limited to: (a) the use of inexpensive and large area silicon substrates; and (b) the use of an AlN interlayer structure with a GaN HEMT structure (the GaN HEMT exhibits improved conductivity due to the AlN interlayer).

The structures in FIGS. 3 and 3A use a single sided AlGaN/AlN/GaN heterojunction. The conductivity is proportional to mobility (while resistivity is inversely proportional to mobility) and is increased by increasing the mobility with the AlN interlayer. It has been discovered that when growing GaN HEMTs on SiC, the electron mobility is increased by inserting an AlN interlayer from approximately 1600 to 2000 cm²/Vs. Also, birefringence is reduced (or in some cases minimized or even eliminated) by bonding (or otherwise securing together) the layer stack to a material with low or no birefringence (of cubic, amorphous, or polycrystalline structure). One important feature of this process is that the crystal growth process, which requires high quality single crystal material of compatible crystalline structure, is not dependent on the choice of final substrate material. This characteristic permits appropriate polycrystalline materials of various lattice constants and orientations. For example, polycrystalline spinel can be used which is cheaper and available in larger areas than single crystal spinel.

Having described preferred embodiments which serve to illustrate various concepts, structures and techniques which are the subject of this patent, it will now become apparent to those of ordinary skill in the art that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A liquid crystal device having optically transparent electrodes, comprising:
   a substrate of optically-transparent material;
   a gallium nitride (GaN) layer disposed above the substrate; and
   a plurality of optically transparent electrodes disposed on an upper surface of the GaN layer, the electrodes of the plurality of electrodes being electrically isolated from each other by non-conducting regions between the electrodes, wherein each of the electrodes of the plurality of electrodes is comprised of one of aluminum nitride (AlN) or aluminum gallium nitride ($Al_xGa_{1-x}N$).

2. The liquid crystal device according to claim 1 wherein said substrate of optically-transparent material corresponds to a substrate of optically-transparent, insulating material.

3. The liquid crystal device according to claim 1 wherein said substrate of optically-transparent material corresponds to one of: Fused Silica, AlON, CaF2, GaAs, GGG (Gd3Ga5O12), sapphire, silicon carbide, polycrystalline SIC, spinel, polycrystalline spinel, $Y_2O_3$, YAG ($Y_3Al_{15}O_{12}$), Zinc Selenide and Zinc Sulphide.

4. The liquid crystal device according to claim 1 wherein the substrate is transparent to the light wavelength of operation of the liquid crystal device.

5. The liquid crystal device according to claim 4 wherein the liquid crystal device corresponds to one of: an optical phased array, an adaptive optic, or a polarization adjusting element.

6. The liquid crystal device according to claim 1 wherein the GaN layer is epitaxially grown to a specified thickness.

7. The liquid crystal device according to claim 6 wherein the plurality of electrodes are formed from an epitaxially grown layer of higher bandgap material than the GaN layer.

8. The liquid crystal device according to claim 6 wherein the electrodes comprised of $Al_xGa_{1-x}N$ or AlN each forms a two-dimensional electron gas, from which conductivity is derived.

9. The liquid crystal device according to claim 1 wherein the electrodes of the plurality of electrodes are formed from a layer of AlN or $Al_xGa_{1-x}N$ using photolithography.

10. The liquid crystal device according to claim 1 wherein the non-conducting regions between the electrodes of the plurality of electrodes are etched away regions.

11. The liquid crystal device according to claim 4 wherein the wavelength of operation corresponds to a frequency in the infrared band.

* * * * *